US012658891B2

(12) United States Patent
Komatsu et al.

(10) Patent No.: US 12,658,891 B2
(45) Date of Patent: *Jun. 16, 2026

(54) MULTIPLEXER WITH REDUCED PHASE SPREADING

(71) Applicant: Skyworks Solutions, Inc., Irvine, CA (US)

(72) Inventors: Tomoya Komatsu, Irvine, CA (US); Yiliu Wang, Irvine, CA (US); Toru Jibu, Kobe (JP)

(73) Assignee: Skyworks Solutions, Inc., Irvine, CA (US)

( * ) Notice: Subject to any disclaimer, the term of this patent is extended or adjusted under 35 U.S.C. 154(b) by 278 days.

This patent is subject to a terminal disclaimer.

(21) Appl. No.: 18/325,583

(22) Filed: May 30, 2023

(65) Prior Publication Data

US 2023/0387887 A1      Nov. 30, 2023

Related U.S. Application Data

(63) Continuation of application No. 17/022,464, filed on Sep. 16, 2020, now Pat. No. 11,705,886.

(60) Provisional application No. 62/902,788, filed on Sep. 19, 2019.

(51) Int. Cl.
*H03H 9/72* (2006.01)
*H03H 9/02* (2006.01)
*H03H 9/64* (2006.01)

(52) U.S. Cl.
CPC .......... *H03H 9/72* (2013.01); *H03H 9/02842* (2013.01); *H03H 9/6483* (2013.01)

(58) Field of Classification Search
CPC .. H03H 9/02; H03H 9/54; H03H 9/70; H03H 9/72
See application file for complete search history.

(56) References Cited

U.S. PATENT DOCUMENTS

| | | | |
|---|---|---|---|
| 7,164,306 B2 | 1/2007 | Makino | |
| 7,907,033 B2 | 3/2011 | Morris, III et al. | |
| 9,444,417 B2 | 9/2016 | Maxim et al. | |
| 9,692,392 B2* | 6/2017 | Cabanillas | H03F 1/56 |
| 9,729,125 B2* | 8/2017 | Nosaka | H03H 9/6423 |
| 9,837,984 B2 | 12/2017 | Khlat et al. | |
| 10,009,054 B2* | 6/2018 | Wloczysiak | H04B 1/10 |
| 10,038,424 B2 | 7/2018 | Hey-Shipton et al. | |
| 10,135,134 B2 | 11/2018 | Chen | |

(Continued)

*Primary Examiner* — Andrea Lindgren Baltzell
*Assistant Examiner* — Alan Wong
(74) *Attorney, Agent, or Firm* — Knobbe, Martens, Olson & Bear, LLP

(57) ABSTRACT

Aspects of this disclosure relate to a multiplexer that includes a first filter and a second filter coupled to a common node. The first filter includes an acoustic filter arranged to filter a radio frequency signal, a matching network coupled between the acoustic filter and the common node, and a parallel circuit coupled in series between the acoustic filter and the common node. The parallel circuit includes an inductive component in parallel with a capacitive component. In certain instances, the first filter is coupled to the common node via a switch, the matching network is coupled to a node between the acoustic filter and the switch, and the parallel circuit is coupled in series between the acoustic filter and the switch. Related methods, radio frequency modules, and wireless communication devices are also disclosed.

19 Claims, 11 Drawing Sheets

(56)  References Cited

U.S. PATENT DOCUMENTS

| | | | | |
|---|---|---|---|---|
| 10,243,538 | B2 | 3/2019 | Kato et al. | |
| 10,250,227 | B2 | 4/2019 | Kando et al. | |
| 10,418,963 | B2 * | 9/2019 | Kitami ................. | H03H 7/1791 |
| 10,581,650 | B2 | 3/2020 | Hashemi et al. | |
| 10,720,899 | B2 | 7/2020 | Takeuchi | |
| 10,778,174 | B2 | 9/2020 | Ta et al. | |
| 10,931,253 | B2 * | 2/2021 | Ta ......................... | H03H 9/6483 |
| 11,043,934 | B2 | 6/2021 | Mori | |
| 11,705,886 | B2 * | 7/2023 | Komatsu .............. | H03H 9/6483 |
| | | | | 333/133 |
| 12,003,263 | B2 * | 6/2024 | Jia ............................ | H03H 7/09 |
| 2019/0363696 | A1 | 11/2019 | Komatsu et al. | |
| 2021/0091751 | A1 | 3/2021 | Komatsu et al. | |

* cited by examiner

40

40′

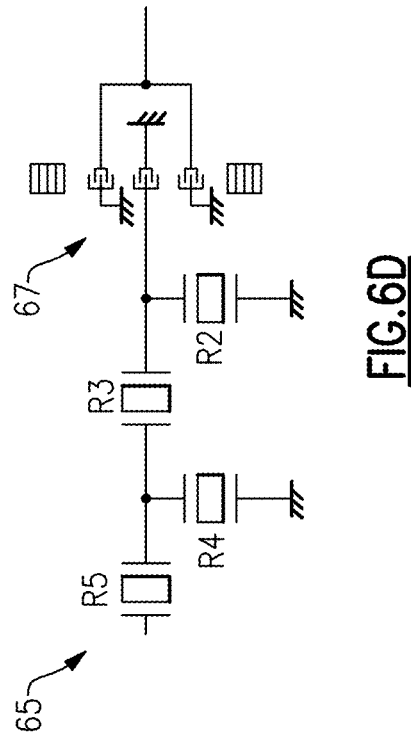
FIG.6D
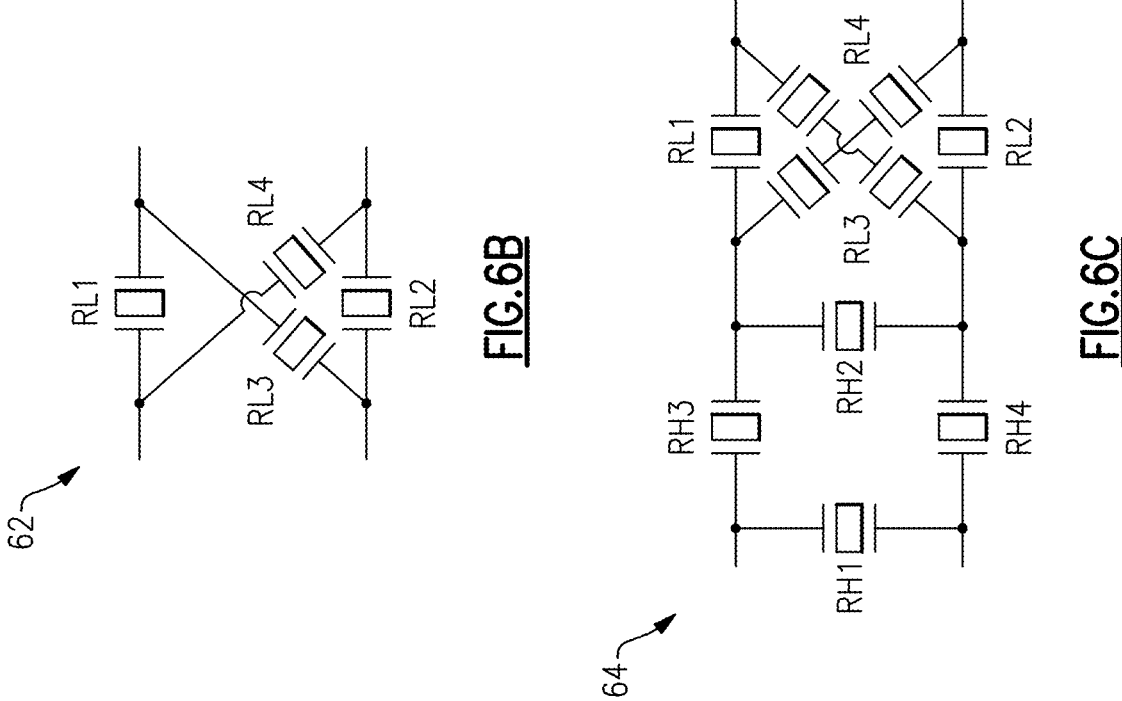
FIG.6B
FIG.6C

72° (B$_A$ f min $-$B$_D$ f max)
46° (B$_B$ f min $-$B$_D$ f max)

91° (B$_A$ f min $-$B$_D$ f max)
60° (B$_B$ f min $-$B$_D$ f max)

$82°$ ($B_A f_{min} - B_D f_{max}$)
$84°$ ($B_B f_{min} - B_D f_{max}$)

58° (B$_A$f$_{min}$ − B$_D$ f$_{max}$)
48° (B$_B$f$_{min}$ − B$_D$ f$_{max}$)

MULTIPLEXER WITH REDUCED PHASE SPREADING

CROSS REFERENCE TO PRIORITY APPLICATION

Any and all applications for which a foreign or domestic priority claim is identified in the Application Data Sheet as filed with the present application are hereby incorporated by reference under 37 CFR § 1.57. This application is a continuation of U.S. application Ser. No. 17/022,464, filed on Sep. 16, 2020, which claims the benefit of priority of U.S. Provisional Patent Application No. 62/902,788, filed Sep. 19, 2019 and titled "MULTIPLEXER WITH REDUCED PHASE SPREADING," the disclosure of which is hereby incorporated by reference in its entirety herein.

BACKGROUND

Technical Field

Embodiments of this disclosure relate to multiplexers that include acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

Multiplexers that include acoustic wave filters can experience phase spreading. Such multiplexers can be used in carrier aggregation applications where it can be desirable for phase spreading to be relatively small for carrier aggregation bands. However, reducing phase spreading can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a multiplexer for filtering radio frequency signals. The multiplexer includes a first radio frequency filter coupled to an common node via a switch. The first filter includes an acoustic filter arranged to filter a radio frequency signal, a matching network coupled to a node between the acoustic filter and the switch, and a parallel circuit coupled in series between the acoustic filter and the switch. The parallel circuit includes an inductive component in parallel with a capacitive component. The multiplexer also includes a second filter coupled to the common node.

The multiplexer can further include a third filter coupled to the common node. The parallel circuit of the first filter can be configured to cause a difference in phase between a reflection coefficient for the first filter at the common node in a passband of the second filter and the reflection coefficient for the first filter at the common node in a passband of the third filter to be reduced. The second filter and the third filter can both have fixed connections to the common node. The multiplexer can include a fourth filter with a fixed connection to the common node. The multiplexer can include a fourth filter coupled to the common node via a second switch. The multiplexer can include a fourth filter coupled to the common node, in which the parallel circuit of the first filter further is configured to cause a difference in phase between the reflection coefficient of the first filter at the common node in the passband of the second filter and the reflection coefficient of the first filter at the common node in a passband of the fourth filter to be reduced.

The matching network can include a shunt inductor. The matching network can include a shunt capacitor. The matching network can include a series inductor. The matching network can include a series capacitor. The matching network can include a Pi matching network. The matching network can be coupled to the switch via the parallel circuit.

The capacitive component can be an acoustic resonator and the inductive component can be an inductor. The capacitive component can be a capacitor and the inductive component can be an inductor.

The multiplexer can further include a second parallel circuit coupled in series between the acoustic filter and the switch. The second parallel circuit can include a second inductive component in parallel with a second capacitive component. The capacitive component can be an acoustic resonator and the second capacitive component can be a capacitor. The inductive component can be a first inductor and the second inductive component can be a second inductor.

The first filter can have a highest passband of all filters of the multiplexer. The first filter can have a lowest passband of all filters of the multiplexer.

The acoustic filter can include a plurality of acoustic wave resonators. The acoustic filter can include one or more acoustic resonators and a multi-mode surface acoustic wave filter. The acoustic filter can include one or more acoustic resonators and an inductor-capacitor circuit.

The multiplexer can further include one or more additional filters coupled to the common node. The first filter can have a passband with a greatest frequency difference from a passband any other filter in the multiplexer.

All filters of the multiplexer can be receive filters. All filters of the multiplexer can be transmit filters. The first filter can be a receive filter and the second filter can be a transmit filter. The first filter can be a transmit filter and the second filter can be a receive filter.

Another aspect of this disclosure is a multiplexer for filtering radio frequency signals. The multiplexer includes a first filter coupled to a common node. The first filter includes an acoustic filter arranged to filter a radio frequency signal, a matching network coupled to a node between the acoustic filter and the common node, and a parallel circuit coupled in series between the acoustic filter and the common node. The parallel circuit includes an inductive component in parallel with a capacitive component. The multiplexer also includes a second filter coupled to the common node. The first filter and the second filter each have a respective fixed connection to the common node.

The matching network can be coupled to the common node via the parallel circuit.

The multiplexer can further include a second parallel circuit coupled in series between the acoustic filter and the common node, in which the second parallel circuit includes a second inductive component in parallel with a second capacitive component.

Another aspect of this disclosure is a radio frequency module that includes a multiplexer in accordance with any principles and advantages disclosed herein and a radio frequency circuit element coupled to the multiplexer. The multiplexer and the radio frequency circuit element are enclosed within a common package.

The radio frequency circuit element can be a radio frequency amplifier arranged to amplify a radio frequency signal. The radio frequency amplifier can be a low noise amplifier. The radio frequency module can include two low noise amplifiers coupled to the multiplexer, where one of the low noise amplifiers is the radio frequency amplifier. The radio frequency amplifier can be a power amplifier. The radio frequency module can further include a switch configured to selectively couple the common node of the multiplexer to an antenna port of the radio frequency module.

The radio frequency circuit element can be a switch configured to selectively couple the multiplexer to an antenna port of the radio frequency module.

Another aspect of this disclosure is a wireless communication device that includes a multiplexer in accordance with any suitable principles and advantages disclosed herein, an antenna operatively coupled to the common node, a radio frequency amplifier operatively coupled to the multiplexer and configured to amplify a radio frequency signal, and a transceiver in communication with the radio frequency amplifier.

The wireless communication device of can further include a baseband processor in communication with the transceiver. The multiplexer can be included in a radio frequency front end. The multiplexer can be included in a diversity receive module.

Another aspect of this disclosure is a method of filtering a radio frequency signal. The method includes receiving a radio frequency signal at a port of the second filter of a multiplexer in accordance with any suitable principles and advantages disclosed herein, and filtering the radio frequency signal with the second filter while a switch is electrically connecting the first filter to the common node.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 6B is a schematic diagram of example acoustic resonators arranged in a lattice topology that can be implemented in any of the filters of FIGS. 3A, 3B, 4A, 4B, 5, 8, and 10.

FIG. 6C is a schematic diagram of example acoustic resonators arranged in a hybrid ladder/lattice topology that can be implemented in any of the filters of FIGS. 3A, 3B, 4A, 4B, 5, 8, and 10.

FIG. 6D is a schematic diagram of example acoustic resonators including acoustic resonators and a multimode surface acoustic wave filter that can be implemented in any of the filters of FIGS. 3A, 3B, 4A, 4B, 5, 8, and 10.

DETAILED DESCRIPTION OF CERTAIN EMBODIMENTS

Figures 1, 2:
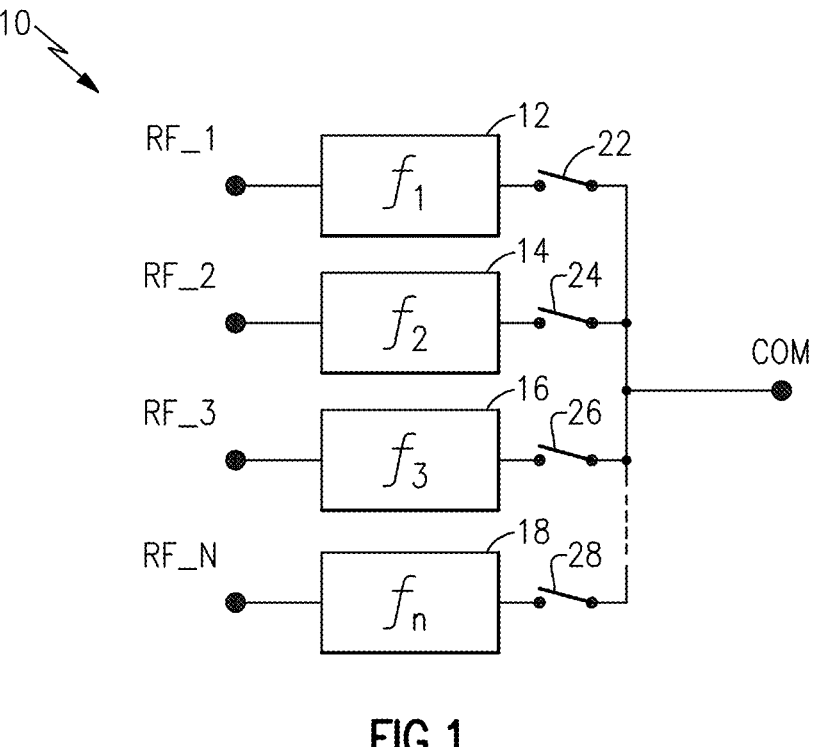
FIG. 1 is a schematic diagram of a multiplexer.
FIG. 2 is a schematic diagram of another multiplexer.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A multiplexer can include acoustic wave filters for carrier aggregation applications. In such applications, it can be desirable for phases for carrier aggregation bands to be close to open at an antenna port of the multiplexer and/or for phase spreading to be relatively small at the antenna port of the multiplexer. If phase spreading of carrier aggregation bands is too wide, there can be problems with loading at the antenna port. In an ideal scenario, a carrier aggregation frequency band can be open at the antenna port of the multiplexer and close to a 0 degree location to reduce and/or eliminate antenna loading loss.

A shunt inductor can be included at an antenna port of a multiplexer for impedance matching and/or phase centering. With a shunt inductor for impedance matching at the antenna port of the multiplexer, phase spreading can be relatively large between passbands of the filters of the multiplexer. As one example, a multiplexer with five acoustic wave filters connected to the antenna port can experience phase spreading of about 90 degrees between pass bands of two filters and phase spreading of about 60 degrees between one of the two filters and another filter of the multiplexer. Phase spreading can represent a difference in phase between a reflection coefficient of a first filter of the multiplexer at the antenna node in a passband of a second filter of the multiplexer and the reflection coefficient of the first filter of the multiplexer at the antenna node in a passband of a third filter of the multiplexer.

Aspects of this disclosure relate to a multiplexer with a filter that includes a parallel circuit coupled in series between acoustic resonators and a common node of the multiplexer. The filter is coupled to the common node via a switch. The parallel circuit includes an inductive component in parallel with a capacitive component. A shunt inductor can be coupled to a node between the acoustic resonators and the common node, such as a node between the acoustic resonators and the parallel circuit. The parallel circuit can reduce phase spreading for a reflection coefficient of the filter in passbands of other filters of the multiplexer. The filter can have the highest passband of all filters of the multiplexer in certain instances. Such a filter can have the largest phase spreading of all filters of the multiplexer in some instances. The filter can be implemented in carrier aggregation applications and/or other applications.

FIG. 1 is a schematic diagram of a multiplexer 10. The multiplexer 10 includes a plurality of filters coupled to a common node COM. As illustrated, the multiplexer 10 includes a filter 12 with a passband $f_1$, a filter 14 with a passband $f_2$, a filter 16 with a passband $f_3$, a filter 18 with a passband $f_N$ coupled to each other at the common node COM by respective switches 22, 24, 26, and 28. Each of the filters 12, 14, 16, and 18 can be a band pass filter with a different passband. The filters 12, 14, 16, and 18 can include acoustic resonators. FIG. 1 illustrates four filters in the multiplexer 10 for illustrative purposes, although any suitable number of filters can be included in any of the multiplexers disclosed herein. The switches 22, 24, 26, and 28 can selectively electrically connect respective filters 12, 14, 16, and 18 to the common node COM. This can electrically connect any suitable combination of the filters 12, 14, 16, and 18 to the common node COM at a given time. The multiplexer 10 can support various carrier aggregations.

The multiplexer 10 implements switched multiplexing. In switched multiplexing, a filter is coupled to a common node via a switch. Switched multiplexing can present different technical challenges than fixed multiplexing. Filters have fixed electrical connections to the common node in fixed multiplexing applications. Fixed multiplexing can be referred to as hard multiplexing.

In fixed multiplexing, the impedance at the common node is typically not open for one filter at a frequency in passband of another filter. Impedance matching and design optimization for filters with fixed connections to a common node of the multiplexer can be implemented in fixed multiplexing applications.

For switched multiplexing, it can be desirable for a filter to have an open impedance at the common node of the multiplexer in a passband of one or more other filters of the multiplexer. For example, when the filter 12 with the passband $f_1$ and the filter 14 with the passband $f_2$ of the multiplexer 10 are electrically connected to the common node COM at the same time via switches 22 and 24, respectively, it can be desirable for the filter 12 to have an open impedance at the common node COM in a passband of the filter 14. This open impedance can reduce and/or eliminate leakage of a radio frequency signal in the passband $f_2$ of the filter 14 into the filter 12. It can be desirable for a filter connected to the common node COM via a switch to have an open impedance in passbands of all other filters concurrently electrically connected to the common node COM. This can apply when three or more filters of the multiplexer 10 are electrically connected to the common node COM concurrently.

In certain applications, the filters 12, 14, 16, and 18 can all be receive filters. Such applications can include diversity receive applications. When the illustrated filters are each receive filters, input/output ports RF_1, RF_2, RF_3, and RF_N can be output ports and the common node COM can serve as an input port. According to some other applications, the filters 12, 14, 16, and 18 can all be transmit filters. When the illustrated filters are each transmit filters, the input/output ports RF_1, RF_2, RF_3, and RF_N can be input ports and the common node COM can serve as an output port. The filters 12, 14, 16, and 18 can include any suitable combination of one or more transmit filters and/or one or more receive filters.

The multiplexer 10 can be implemented in carrier aggregation applications. In certain carrier aggregation specifications, phases for carrier aggregation bands for gamma of one filter are specified to be relatively close to open impedance and/or phase spreading is specified to be relatively small. In an example application, if phase spreading for a mid-low band to mid-band is too wide, there can be a problem with loading at the common node COM of the multiplexer 10. It can be ideal to provide an open impedance for carrier aggregation bands with close to a 0 degree phase to reduce and/or eliminate loading loss. Filters that will be discussed with reference to FIGS. 3A, 3B, 4A, 4B 5, 8, and 10 can be implemented in the multiplexer 10 to provide an impedance at the common node COM that is relatively close to an open impedance and also achieve reduced phase spreading.

FIG. 2 is a schematic diagram of a multiplexer 20. The multiplexer 20 includes filters 12, 14, and 16 with fixed connections to a common node COM and a filter 18 coupled to the common node COM via the switch 28. Accordingly, the multiplexer 20 implements a combination of fixed multiplexing and switched multiplexing. Each of the filters 12, 14, 16, and 18 can be a band pass filter with a different passband. In the multiplexer 20, the filter 18 can have the highest passband of all filters of the multiplexer 20 (i.e., $f_N$>each of $f_1$, $f_2$, $f_s$) in certain applications. The filters 12, 14, 16, and 18 can each include acoustic resonators. In the multiplexer 20, it can be desirable for the filter 18 to have an open impedance at the common node COM in the respective passbands $f_1$, $f_2$, and $f_3$ of the filters 12, 14, and 16. At the same time, it can be desirable for there to be a relatively small amount of phase spreading for the reflection coefficient of the filter 18 in the passbands $f_1$, $f_2$, and $f_3$ of the filters 12, 14, and 16, respectively.

Examples of the filter 18 of the multiplexer 10 and/or 20 will be described with reference to FIGS. 3A, 3B, 4A, 4B, 5, 8, and 10. The filter 18 can have a passband that is farthest away from passbands of other filters of the multiplexer. In certain applications, the filter can have the highest passband of all filters of a multiplexer. The filter 18 can have the lowest passband of all filters of a multiplexer in some other applications. The filters of FIGS. 3A, 3B, 4A, 4B, 5, 8, and 10 can be included in a multiplexer and coupled to a common node via a switch. Alternatively or additionally, the filters of FIGS. 3A, 3B, 4A, 4B, 5, 8, and 10 can be included in a filter of multiplexer with a fixed connection to the common node of the multiplexer. Any suitable combination of features of the filters of FIGS. 3A, 3B, 4A, 4B, 5, 8, and 10 can be implemented together with each other. Two or more filters of a multiplexer can include any suitable combination of features of the filters of FIGS. 3A, 3B, 4A, 4B, 5, 8, and 10 in certain applications.

Figures 3A, 3B:
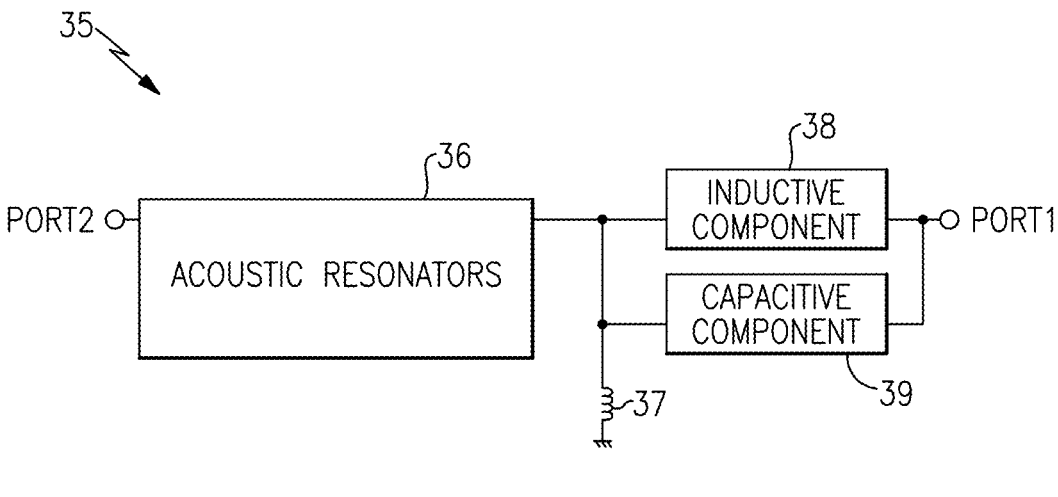
FIG. 3A is a schematic diagram of a filter according to an embodiment.
FIG. 3B is a schematic diagram of a filter according to another embodiment.

FIG. 3A is a schematic diagram of a filter 35 according to an embodiment. The filter 35 is an example of the filter 18 of FIGS. 1 and 2. The filter 35 can be implemented in the multiplexer 10 and/or the multiplexer 20. In some instances, two or more filters of the multiplexer 10 and/or the multiplexer 20 can have the topology shown in FIG. 3A. As illustrated, the filter 35 includes an acoustic filter 36, a shunt inductor 37, and a parallel circuit that includes an inductive component 38 in parallel with a capacitive component 39. The filter 35 is coupled between a first port PORT1 and a second port PORT2. The filter 35 can be coupled to the common node of a multiplexer via a switch coupled between the first port PORT1 and the common node. The common node of the multiplexer can be an antenna port.

In the filter 35, the parallel circuit is coupled in series between the acoustic filter 36 and the first port PORT1. The acoustic filter 36 includes one or more acoustic components arranged to filter a signal. For example, in certain embodiments, the acoustic filter 36 can include (a) a plurality of acoustic resonators, (b) one or more acoustic resonators and a multi-mode surface acoustic wave filter, or (c) one or more acoustic resonators and an inductor-capacitor (LC) circuit. The shunt inductor 37 is an example of a matching network. While the shunt inductor 37 is shown in certain embodiments for illustrative purposes, another suitable matching network can be implemented in place of and/or in addition to the shunt inductor 37 of any such embodiments. Examples of other matching networks will be discussed with reference to FIG. 3B.

The inductive component 38 in parallel with the capacitive component 39 can create a resonance. The resonance can reduce reflection coefficient (gamma) phase spreading in a certain frequency range. The combined impedance of the inductive component 38 and the capacitive component 39 can be relatively high at a frequency in a passband of the filter 35. In such a case, the shunt inductor 37 can be coupled to a node between the acoustic filter 36 and the parallel circuit for impedance matching. In the filter 35, the combined impedance of the inductive component 38 and the capacitive component 39 can alternatively be relatively low at a frequency in a passband of the filter 35. As illustrated in FIG. 3A, the parallel circuit is coupled in series between the shunt inductor 37 and the first port PORT1 of the filter 35.

FIG. 3B is a schematic diagram of a filter 35' according to an embodiment. The filter 35' is another example of the filter 18 of FIGS. 1 and 2. The filter 35' can be implemented in the multiplexer 10 and/or the multiplexer 20. In some instances, two or more filters of the multiplexer 10 and/or the multiplexer 20 can have the topology shown in FIG. 3A. The filter 35' is like the filter 35 except that a matching network 42 is included in place of the shunt inductor 37. The matching network 42 can be implemented by the shunt inductor 37 in certain instances, such as in the filter 35 shown in FIG. 3A. The matching network 42 can include any other suitable matching network. Other suitable matching networks can include a shunt capacitor, a Pi matching network (e.g., an inductor-capacitor-inductor Pi matching network), a series inductor, a series capacitor, the like, or any suitable combination thereof. A matching network can include a single passive impedance element in certain instances. A matching network can include two or more passive impedance elements in some other instances. Any suitable embodiment disclosed herein can be modified to include a suitable matching network 42 in place of a shunt inductor 37.

Figure 4A:
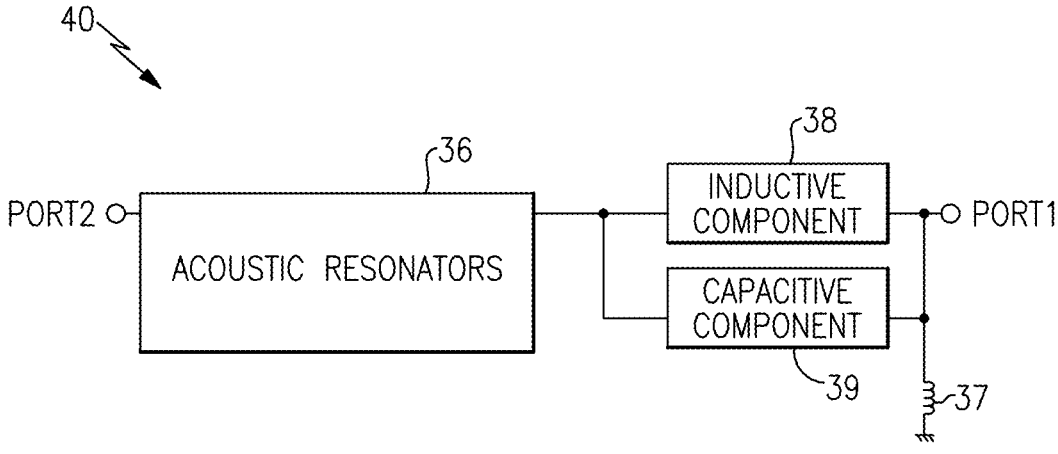
FIG. 4A is a schematic diagram of a filter according to another embodiment.

FIG. 4A is a schematic diagram of a filter 40 according to an embodiment. The filter 40 is another example of the filter 18 of FIGS. 1 and 2. The filter 40 can be implemented in the multiplexer 10 and/or the multiplexer 20. In some instances, two or more filters of the multiplexer 10 and/or the multiplexer 20 can have the topology shown in FIG. 4A. The filter 40 is like the filter 35 except that the shunt inductor 37 is connected at a different node. In the filter 40, the shunt inductor 37 is connected to the first port PORT1. The inductive component 38 and the capacitive component 39 can have combined impedance that is relatively low at a frequency in the passband of the filter 40. The parallel circuit is coupled in series between the shunt inductor 37 and the acoustic filter 36 in the filter 40. The filter 40 can be coupled to the common node of a multiplexer via a switch coupled between the first port PORT1 and the common node. The common node of the multiplexer can be an antenna port.

Any suitable embodiment disclosed herein can be modified to have the shunt inductor 37 connected to the first port PORT1 as shown in FIG. 4A. For example, in any of the filters of FIG. 5, 8, or 10, the shunt inductor 37 can alternatively be arranged as shown in FIG. 4A. Moreover, in some instances, two shunt inductors can be implemented in which one is arranged as shown in FIG. 3A and the other is arranged as shown in FIG. 4A.

Figure 4B:
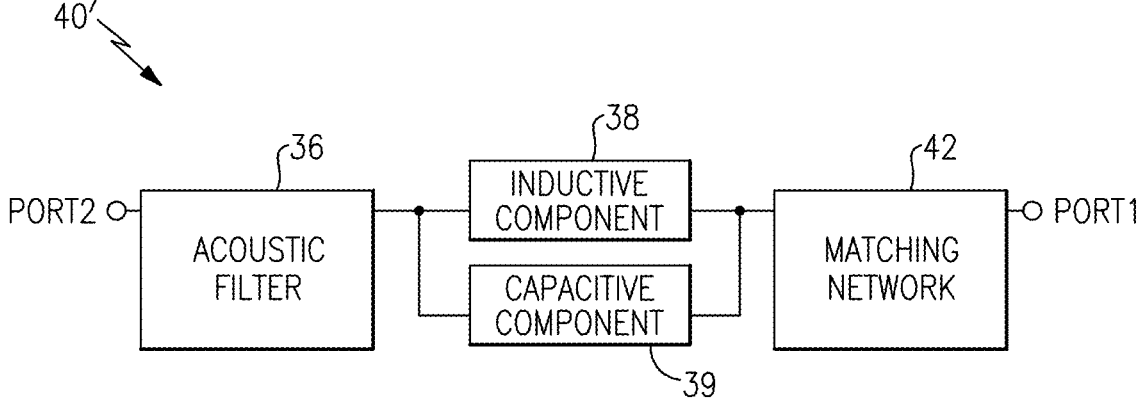
FIG. 4B is a schematic diagram of a filter according to another embodiment.

FIG. 4B is a schematic diagram of a filter 40' according to an embodiment. The filter 40' is another example of the filter 18 of FIGS. 1 and 2. The filter 40' can be implemented in the multiplexer 10 and/or the multiplexer 20. In some instances, two or more filters of the multiplexer 10 and/or the multiplexer 20 can have the topology shown in FIG. 4B. The filter 40' is like the filter 40 FIG. 4A except that a matching network 42 is included in place of the shunt inductor 37. The matching network 42 can be any of the matching networks discussed with reference to FIG. 3B.

Figure 5:
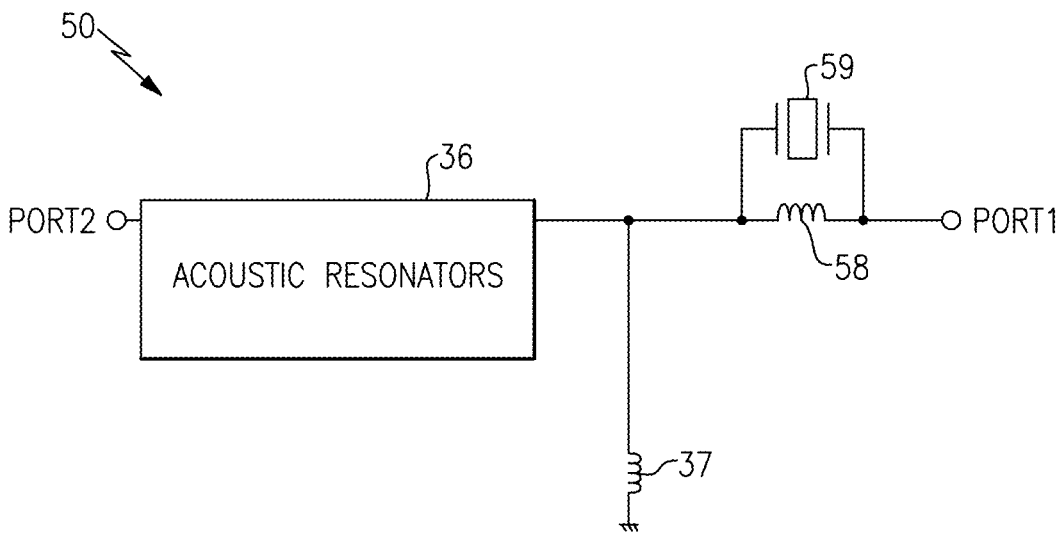
FIG. 5 is a schematic diagram of a filter according to an embodiment.

FIG. 5 is a schematic diagram of a filter 50 according to an embodiment. The filter 50 is an example of the filter 35 of FIG. 3A in which the parallel circuit includes an inductor 58 in parallel with an acoustic resonator 59. The inductor 58 is an example of the inductive component 38. The acoustic resonator 59 is an example of the capacitive component 39. With a relatively small acoustic resonator 58 and larger inductance inductor 58, a high impedance can be presented at the first port PORT1. This can shift the whole impedance contour to higher impedance, which can result in better phase centering and smaller phase spreading. At the same time, the magnitude of the reflection coefficient (gamma) can be increased. Since the acoustic resonator 59 has low impedance at its resonant frequency and the resonant frequency can be within the passband of the filter 50, the acoustic resonator 59 should not significantly impact insertion loss of the filter 50 in its passband.

The inductor 58 can be any suitable inductor, such as a surface mount technology (SMT) inductor, a conductive trace of a substrate, an integrated passive device (IPD) inductor, or the like. In instances where the inductor 58 has a relatively high inductance, the inductor 58 can be a SMT inductor.

The acoustic resonator 59 can be a surface acoustic wave resonator e.g., (a temperature compensated surface acoustic wave resonator, a non-temperature compensated surface acoustic wave resonator, or multi-layer piezoelectric substrate surface acoustic wave resonator), a bulk acoustic wave resonator, or any other suitable acoustic resonator. As one example, the acoustic resonator 59 can be a temperature compensated surface acoustic wave resonator. The acoustic resonator 59 can be implemented on the same die as one or more acoustic resonators of the acoustic filter 36 in certain applications. For instance, in some such applications, the acoustic resonator 59 can be implemented on the same die as all acoustic resonators of the acoustic filter 36.

The acoustic filter 36 of FIGS. 3A, 3B, 4A, 4B, 5, 8, and 10 can be arranged in any suitable topology, such as a ladder topology, a lattice topology, a combined lattice and ladder topology, or the like. A filter with any of these topologies can be arranged to filter radio frequency signals. A filter with any of these topologies can be arranged as a band pass filter. The acoustic filter 36 can include one or more multi-mode surface acoustic wave (MMS) filters in certain applications. The acoustic filter 36 can include a combined ladder and MMS filter in some applications. The acoustic filter 36 can include one or more acoustic resonators together with an LC circuit. Example topologies are shown in FIGS. 6A to 6D.

Figure 6A:
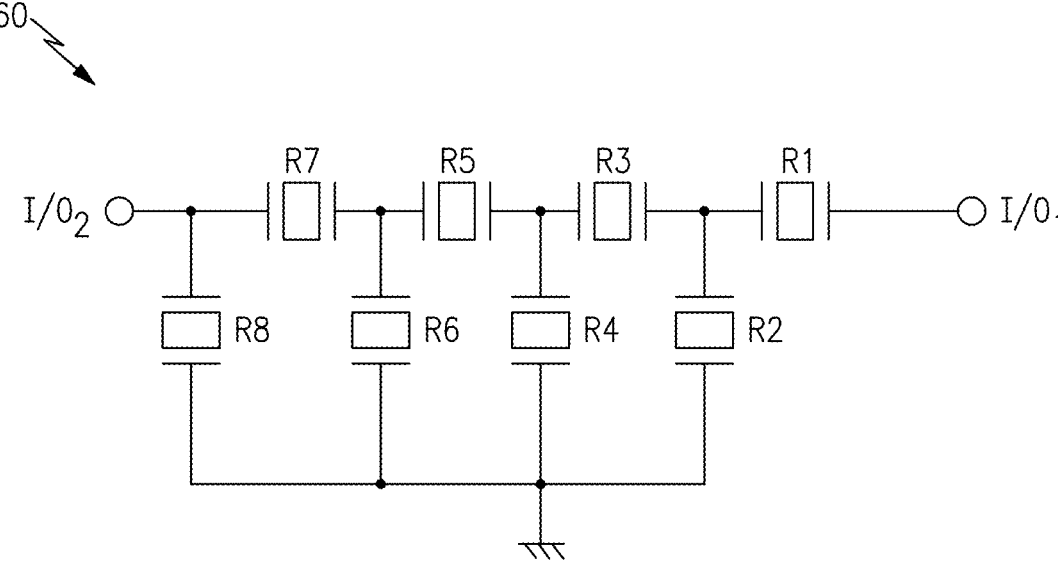
FIG. 6A is a schematic diagram of example acoustic resonators arranged in a ladder topology that can be implemented in any of the filters of FIGS. 3A, 3B, 4A, 4B, 5, 8, and 10.

FIG. 6A is a schematic diagram of acoustic resonators 60 arranged in a ladder topology. The acoustic resonators 60 illustrate one example topology of the acoustic filter 36. As shown in FIG. 6A, the acoustic resonators include series resonators R1, R3, R5, and R7 and shunt resonators R2, R4, R6, and R8 coupled between input/output nodes I/O$_1$ and I/O$_2$. The first input output node I/O$_1$ can be the node coupled to the parallel circuit. As illustrated, the acoustic resonators 60 can start with a series resonator R1 from the input/output port I/O$_1$. Accordingly, all other resonators of the acoustic resonators 60 can be coupled to the parallel circuit via the series resonator R1. In such a configuration, the acoustic resonators 60 can start with the series resonator R1 from the parallel circuit. The second input output node I/O$_2$ can be the node coupled to the second port PORT2 of a filter that includes the acoustic resonators 60. The acoustic resonators 60 can be arranged as a band pass filter to filter a radio frequency signal. The acoustic resonators 60 can include one or more surface acoustic wave resonators, one or more bulk acoustic wave resonators, one or more boundary wave resonators, one or more Lamb wave resonators, the like, or any suitable combination thereof.

FIG. 6B is a schematic diagram of acoustic resonators arranged as the lattice filter 62. The lattice filter 62 illustrates another example topology of the acoustic filter 36. As illustrated, the lattice filter 62 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 62 has a balanced input and a balanced output. The acoustic resonators of the lattice filter 62 can include one or more surface acoustic wave resonators, one or more bulk acoustic wave resonators, one or more boundary wave resonators, one or more Lamb wave resonators, the like, or any suitable combination thereof.

FIG. 6C is a schematic diagram of a hybrid ladder and lattice filter 64. The hybrid ladder and lattice filter 64 illustrates another example topology of the acoustic filter 36. The illustrated hybrid ladder and lattice filter includes series acoustic resonators RL1, RL2, RH3, and RH4 and shunt acoustic resonators RL3, RL4, RH1, and RH2. The acoustic resonators of the hybrid ladder and lattice filter 64 can include one or more surface acoustic wave resonators, one or more bulk acoustic wave resonators, one or more boundary wave resonators, one or more Lamb wave resonators, the like, or any suitable combination thereof.

FIG. 6D is a schematic diagram of an acoustic filter 65 that includes ladder stages and a multi-mode surface acoustic wave filter 67. The acoustic filter 65 illustrates another example topology of the acoustic filter 36. The illustrated acoustic filter 65 includes series resonators R3 and R5, shunt resonators R2 and R4, and multi-mode surface acoustic wave filter 67. The filter 65 can be a receive filter. The multi-mode surface acoustic wave filter 67 can be connected to a receive port. The multi-mode surface acoustic wave filter 67 includes longitudinally coupled interdigital transducer (IDT) electrodes. The multi-mode surface acoustic wave filter 65 can include a temperature compensation layer over longitudinally coupled IDT electrodes in certain applications. The acoustic resonators R2, R3, R4, and R5 of the acoustic filter 65 can include one or more surface acoustic wave resonators, one or more bulk acoustic wave resonators, one or more boundary wave resonators, one or more Lamb wave resonators, the like, or any suitable combination thereof.

Figure 7B:
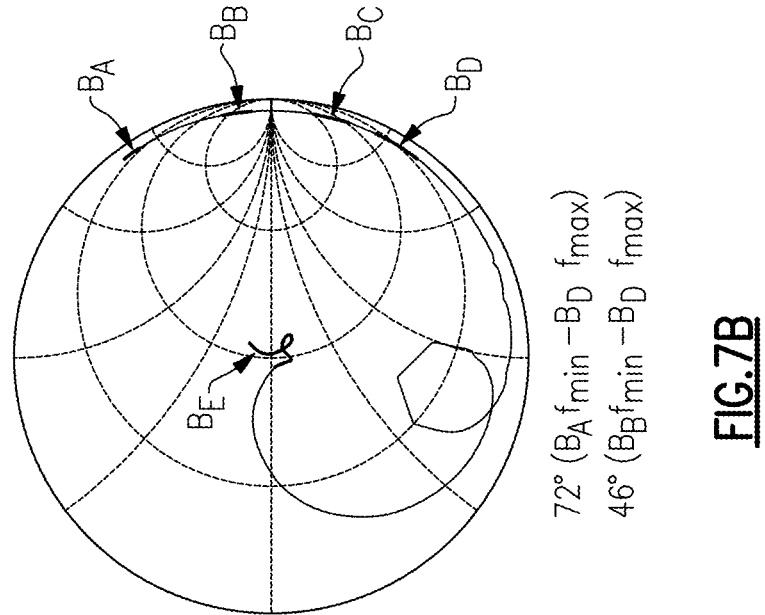
FIG. 7B is a Smith chart for the filter of FIG. 5.
Figure 7A:
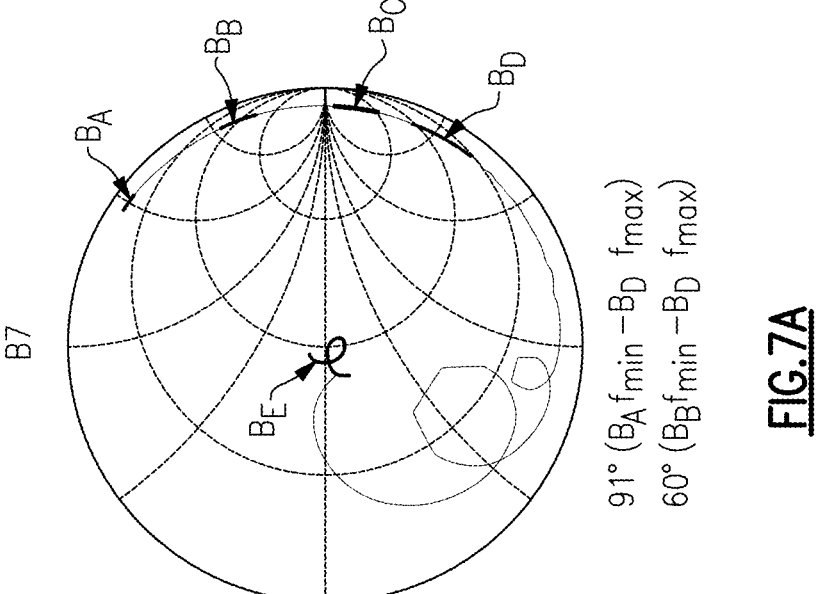
FIG. 7A is a Smith chart for a baseline filter.

FIG. 7A is a Smith chart for a baseline filter. The baseline filter is included in a multiplexer with four other filters coupled to a common node. The four other filters have respective passbands B$_A$, B$_B$, B$_C$, and B$_D$. The baseline filter has passband BE. The baseline filter is similar to the filter 50 of FIG. 5 without the inductor 58 and the acoustic resonator 59. FIG. 7A illustrates gamma spreading for the passbands of the four other filters at the common node of the multiplexer. For example, there is a 91 degree phase between the minimum frequency of passband B$_A$ and the maximum frequency of passband B$_D$ in FIG. 7A. As another example, there is a 60 degree phase between the minimum frequency of passband B$_B$ and the maximum frequency of passband B$_D$ in FIG. 7A.

FIG. 7B is a Smith chart for the filter 50 of FIG. 5. The filter 50 is included in a multiplexer with four other filters coupled to a common node. The four other filters have respective passbands B$_A$, B$_B$, B$_C$, and B$_D$. The filter 50 has passband BE. FIG. 7B illustrates that gamma spreading for the passbands of the four other filters at the common node of the multiplexer for the filter 50 is reduced relative to the baseline filter. For example, there is a 72 degree phase between the minimum frequency of passband B$_A$ and the maximum frequency of passband B$_D$ in FIG. 7B. This is a 19 degree improvement compared to the baseline filter. As another example, there is a 46 degree phase between the minimum frequency of passband B$_B$ and the maximum frequency of passband B$_D$ in FIG. 7B. This is a 14 degree improvement compared to the baseline filter. FIG. 7B also indicates that the magnitude of gamma in the passbands $B_A$, $B_B$, $B_C$, and $B_D$ is increased relative to the Smith chart of FIG. 7A.

Figure 8:
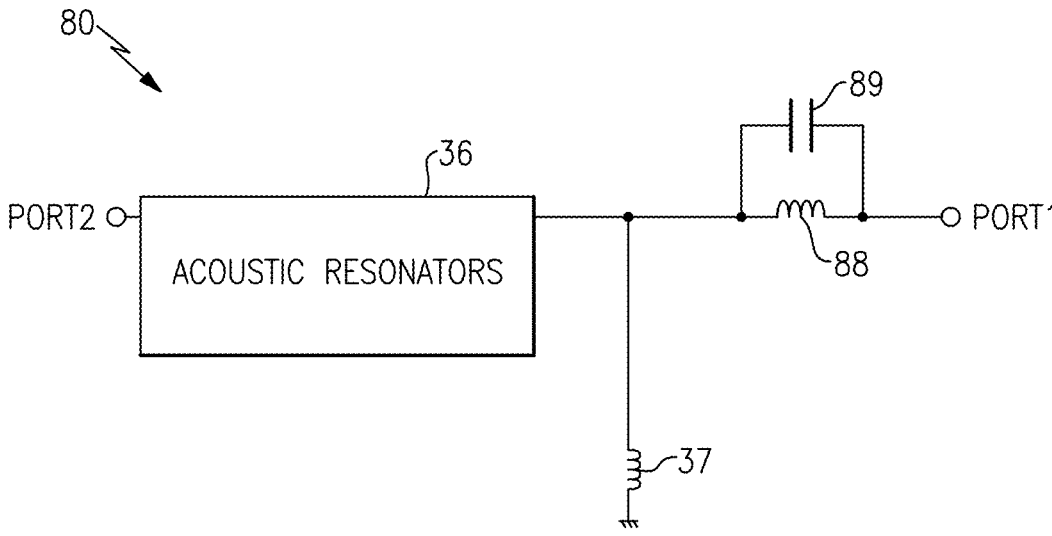
FIG. 8 is a schematic diagram of a filter according to an embodiment.

FIG. 8 is a schematic diagram of a filter 80 according to an embodiment. The filter 80 is an example of the filter 35 of FIG. 3A in which the parallel circuit includes an inductor 88 in parallel with a capacitor 89. The filter 80 is like the filter 50 of FIG. 5 except that the capacitive component of the parallel circuit is implemented by the capacitor 89 instead of the acoustic resonator 59. The inductor 88 can have a different inductance than the inductor 58 of FIG. 5. The filter 80 can consume less area than the filter 50 in some applications.

By using the capacitor 89 for the capacitive component and the inductor 88 for inductive component of the parallel circuit, an open notch can be created at a frequency f according to Equation 1. In Equation 1, L is the inductance of the inductor 88 and C is the capacitance of the capacitor 89.

$$f = \frac{1}{2\pi\sqrt{LC}} \qquad \text{(Eq. 1)}$$

The frequency f of the open notch can between passbands of two other filters of the multiplexer. Accordingly, the open notch can improve gamma phase centering between the passbands of the two other filters of the multiplexer. The open notch can also contribute to gamma having a desirable magnitude. The open notch can be at a frequency significantly below the passband of the filter 80. Accordingly, there can be no significant impact on insertion loss of the filter 80 in its passband.

The capacitance of the capacitor 89 can be relatively large and the inductance of the inductor 88 can be relatively small such that the combined LC circuit has a relatively low impedance. This can result in a relatively small impact of the capacitor 89 and the inductor 88 on insertion loss of the filter 80.

The capacitor 89 can be implemented by any suitable capacitor, such as a capacitor on the same die as one or more acoustic resonators of the acoustic filter 36, a SMT capacitor, an IPD capacitor, or the like. The inductor 88 can be any suitable inductor, such as a SMT inductor, a conductive trace of a substrate, an IPD inductor, or the like. In some instances, the inductor 88 is a SMT inductor.

Figure 9:
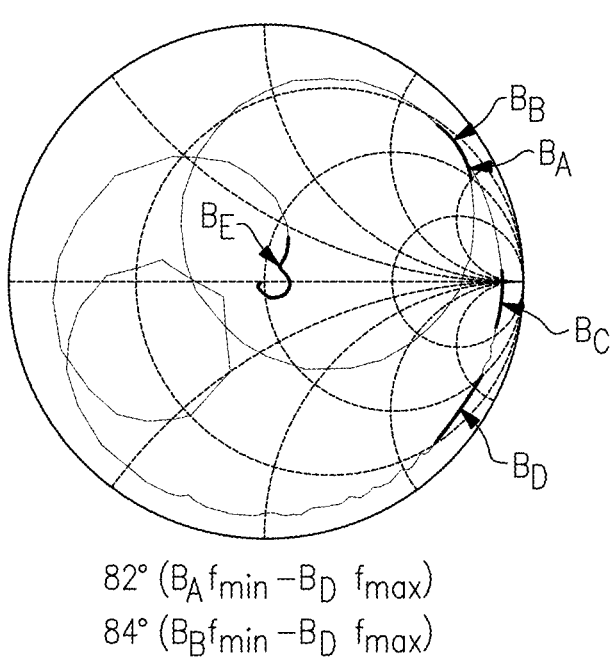
FIG. 9 is a Smith chart for the filter of FIG. 8.

FIG. 9 is a Smith chart for the filter 80 of FIG. 8. The filter 80 is included in a multiplexer with four other filters coupled to a common node. The four other filters have respective passbands $B_A$, $B_B$, $B_C$, and $B_D$. The filter 80 has passband BE. Compared to the Smith chart for the baseline filter in FIG. 7A, the Smith chart of FIG. 9 shows that the phase between passbands $B_A$ and $B_B$ is reduced. This can result from the open notch created by the inductor 88 and the capacitor 90 being at a frequency between passbands $B_A$ and $B_B$. There is an 82 degree phase between the minimum frequency of passband $B_A$ and the maximum frequency of passband $B_D$ in FIG. 9. This is a 9 degree improvement compared to the baseline filter. The phase difference between the minimum frequency of passband $B_B$ and the maximum frequency of passband $B_D$ is increased in FIG. 9 relative to FIG. 7A, but this phase difference is still below that maximum phase spreading in FIG. 7A. The magnitude of gamma is slightly degraded in the Smith chart of FIG. 9 relative to the Smith chart of FIG. 7A. This can be due to the quality factor of the inductor 88. If the inductor 88 has a higher quality factor than simulated, gamma can increase relative to what is shown in the Smith chart of FIG. 9.

Figure 10:
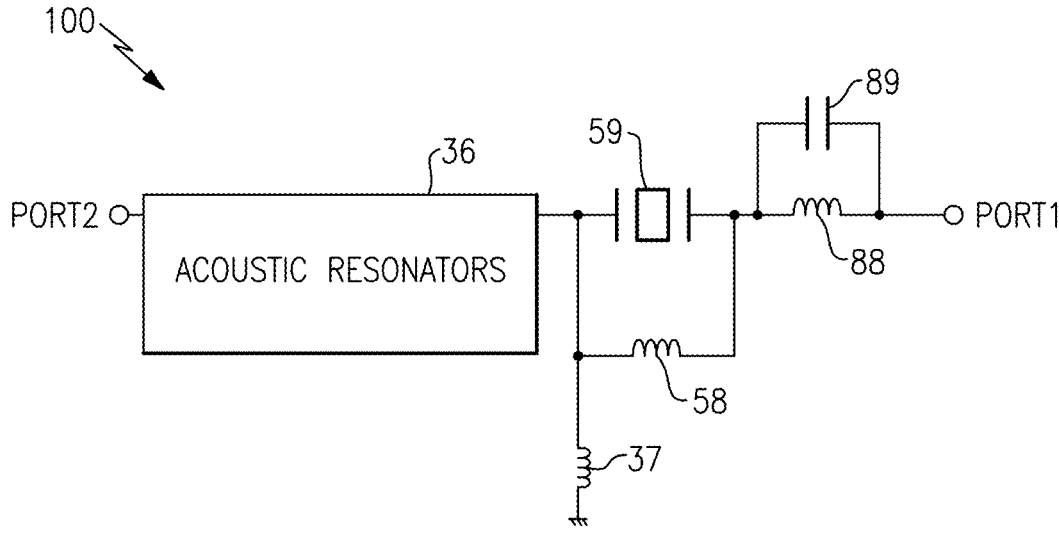
FIG. 10 is a schematic diagram of a filter according to an embodiment.

FIG. 10 is a schematic diagram of a filter 100 according to an embodiment. The filter 10 includes features of the filters 50 and 80. The filter 100 includes both the parallel circuit of the filter 50 (i.e., the inductor 58 and the acoustic resonator 59) and the parallel circuit of the filter 80 (i.e., the inductor 88 and the capacitor 89) in series between the acoustic filter 36 and the first port PORT1. Including the parallel circuits in series between the acoustic filter 36 and the first port PORT1 as shown in FIG. 10 can reduce phase spreading relative to implementing only one of the parallel circuits. The filter 100 can be implemented in applications where reduced phase spreading is desired and/or where more area is available to implement the parallel circuits.

Figure 11:
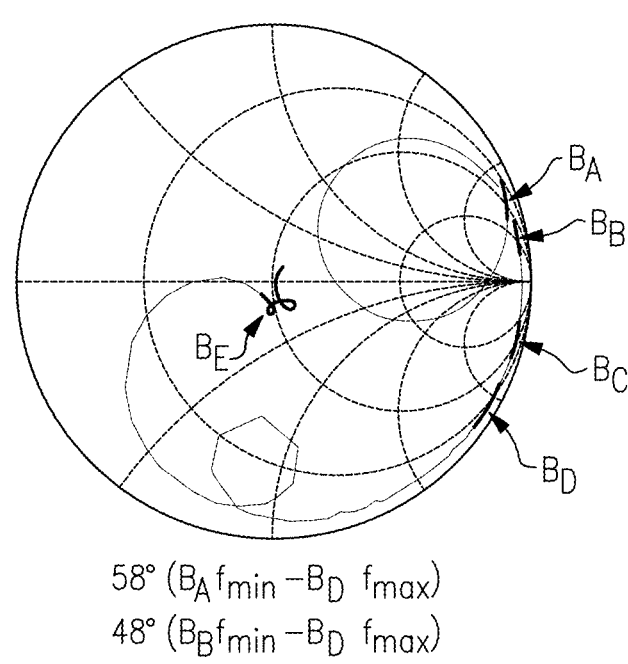
FIG. 11 is a Smith chart for the filter of FIG. 10.
Figure 12:
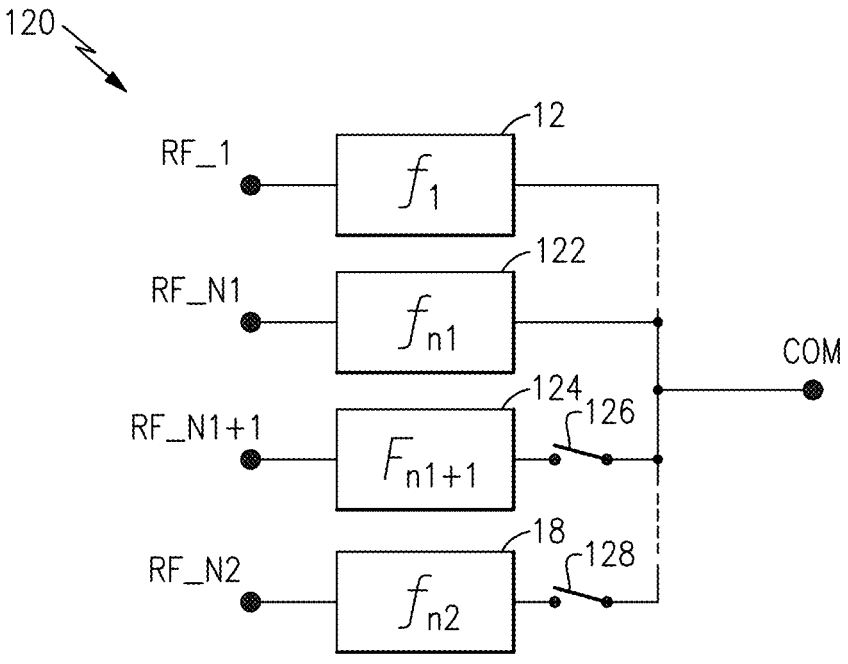
FIG. 12 is a schematic diagram of multiplexer.

FIG. 11 is a Smith chart for the filter 100 of FIG. 10. For this Smith chart, the filter 100 is included in a multiplexer with four other filters coupled to a common node. The four other filters have respective passbands $B_A$, $B_B$, $B_C$, and $B_D$. The filter 100 has passband BE. FIG. 11 indicates that gamma spreading for the passbands of the four other filters at the common node of the multiplexer for the filter 100 is reduced relative to the baseline filter, the filter 50, and the filter 80. For example, there is a 58 degree phase between the minimum frequency of passband $B_A$ and the maximum frequency of passband $B_D$ in FIG. 11. This is a 33 degree improvement compared to the baseline filter. As another example, there is a 48 degree phase between the minimum frequency of passband $B_B$ and the maximum frequency of passband $B_D$ in FIG. 11. This is a 12 degree improvement compared to the baseline filter FIG. 12 is a schematic diagram of multiplexer 120. As illustrated, the multiplexer 120 includes a plurality of filters 12 and 122 with fixed connections to the common node COM and a plurality of filters 18 and 124 coupled to the common node COM via respective switches.

The filters 12 and 122 have fixed connections to the common node COM. The filter 12 is coupled between the input/output port RF_1 and the common node COM. The filter 122 is coupled between the input/output port RF_N1 and the common node COM. FIG. 12 illustrates that any suitable number of filters can have fixed connections to a common node COM of a multiplexer. In some instances, the filter 122 can be implemented in accordance with any suitable principles and advantages of the filters 30, 40, 50, 80, and/or 100

The filters 124 and 18 are coupled to the common node COM by respective switches 126 and 128. The filter 124 is coupled between the input/output port RF_N1+1 and the common node COM. The filter 18 is coupled between the input/output port RF_N2 and the common node COM. The filters 124 and/or 18 can be implemented in accordance with any suitable principles and advantages disclosed herein. For example, the filters 124 and/or 18 can include any suitable combination of features of the filters 30, 40, 50, 80, and/or 100. FIG. 12 illustrates that switched multiplexing can be implemented by any suitable number of filters of a multiplexer. In certain embodiments, the filter 18 can have the highest passband of all filters of the multiplexer 120. Alternatively or additionally, the filter 124 can have the lowest passband of all filters of the multiplexer 120.

Multiplexers disclosed herein can include only receive filters in certain applications. Multiplexers disclosed herein can include only transmit filters in some other applications. Multiplexers disclosed herein can include any suitable combination of one or more transmit filters and one or more receive filters in various applications. A filter implemented in accordance with any suitable principles and advantages of any of FIGS. 3A, 3B, 4A, 4B, 5, 8, and 10 can coupled to a common node of any such multiplexers via a switch. A filter implemented in accordance with any suitable principles and advantages of any of FIGS. 3A, 3B, 4A, 4B, 5, 8, and 10 can coupled to a common node of any such multiplexers without an intervening switch.

Multiplexers disclosed herein can include one or more filters arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can be implemented in accordance with any suitable principles and advantages disclosed herein. A multiplexer with a filter having reduced gamma spreading can be advantageous for meeting specifications related to 5G NR technology. As one example, such a multiplexer can be advantageous for 5G NR carrier aggregation applications.

Multiplexers disclosed herein can include one or more filters arranged to filter a radio frequency signal in a fourth generation (4G) Long Term Evolution (LTE) operating band. Multiplexers disclosed herein can include one or more filters having a passband that spans a 5G NR FR1 operating band and also a 4G LTE operating band. For example, multiplexers disclosed herein can be implemented in dual connectivity applications, such as Evolved Universal Terrestrial Radio Access (E-UTRA) NR Dual Connectivity (EN-DC).

Filters disclosed herein, such as the filters of FIGS. 3A, 3B, 4A, 4B, 5, 8, and 10, can filter radio frequency signals within a frequency range from 600 megahertz (MHz) to 3 gigahertz (GHz) in certain applications. In some such applications, filters disclosed herein can filter radio frequency signals within a frequency range from 1.5 GHz to 2.5 GHz.

The multiplexers disclosed herein can support a variety of carrier aggregations. Example, carrier aggregations supported by the multiplexers disclosed herein include without limitation the carrier aggregations identified in Table 1 below.

TABLE 1

| Example Carrier Aggregations | |
| --- | --- |
| First Carrier | Second Carrier |
| High Band | Mid Low Band |
| Mid Band | Low Band |
| Mid Band | High Band |
| Mid Band | Mid Band |

Figures 13, 14, 15:
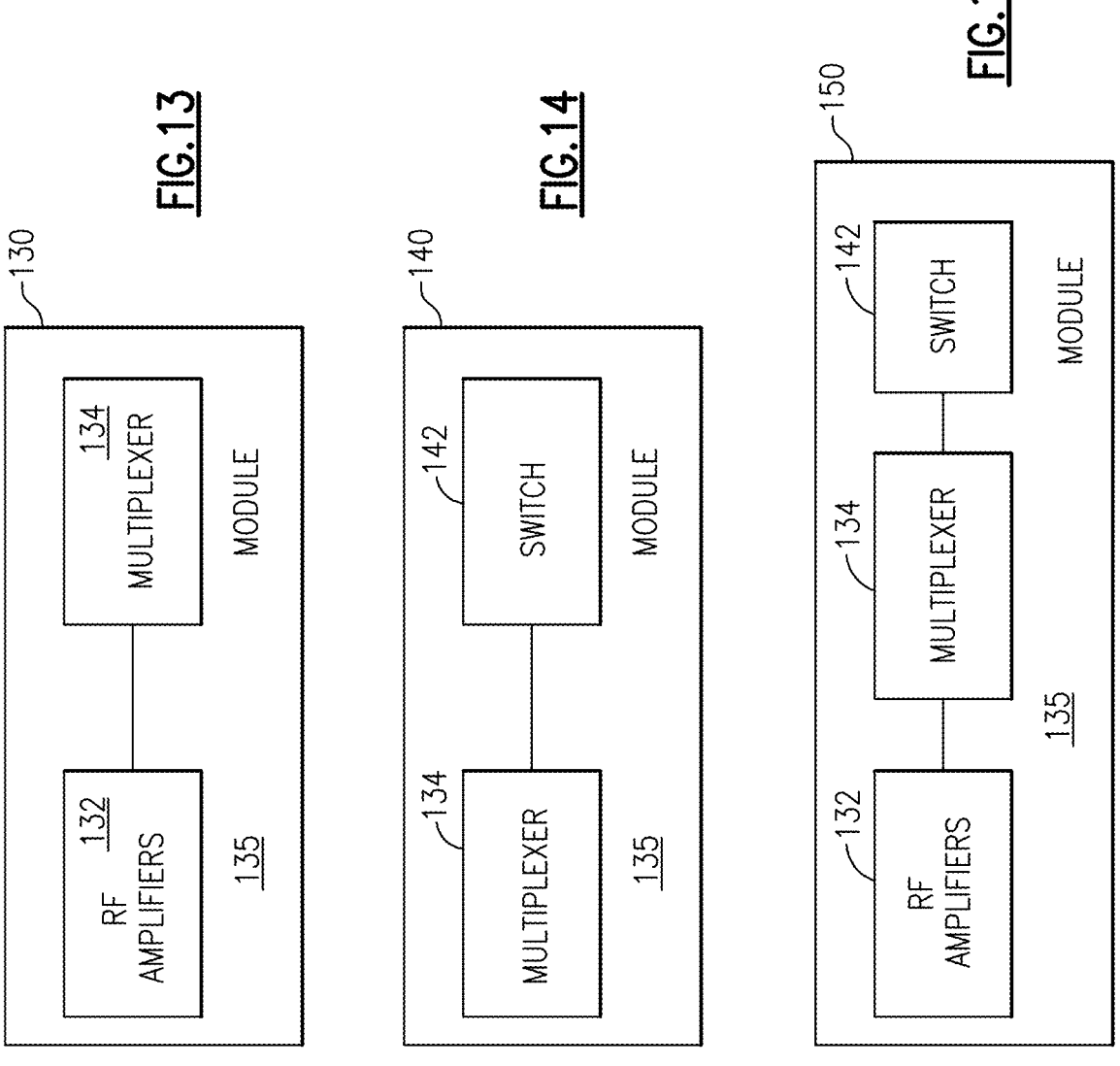
FIG. 13 is a schematic block diagram of a module that includes radio frequency amplifiers and a multiplexer according to an embodiment.
FIG. 14 is a schematic block diagram of a module that includes a multiplexer and a switch according to an embodiment.
FIG. 15 is a schematic block diagram of a module that includes radio frequency amplifiers, a multiplexer, and a switch according to an embodiment.

The multiplexers disclosed herein can be implemented in a variety of packaged modules. Some example packaged modules will now be discussed in which any suitable principles and advantages of the multiplexers disclosed herein can be implemented. A module including two or more chips can be referred to as a multi-chip module. A module that includes a circuit element arranged to process a radio frequency signal can be referred to as a radio frequency module. The example packaged modules can include a package that encloses the illustrated circuit elements. The illustrated circuit elements can be disposed on a common packaging substrate. FIGS. 13, 14, and 15 are schematic block diagrams of illustrative packaged modules according to certain embodiments. Any suitable combination of features of these modules can be implemented with each other.

FIG. 13 is a schematic block diagram of a module 130 that includes one or more radio frequency amplifiers 132 and a multiplexer 134 on a common packaging substrate 135 according to an embodiment. The one or more radio frequency amplifiers 132 can include one or more low noise amplifiers. Alternatively or additionally, the one or more radio frequency amplifiers 132 can include one or more power amplifiers. The one or more radio frequency amplifiers 132 can amplify signals that are filtered and output by the multiplexer 134. For example, one or more low noise amplifiers of the one or more radio frequency amplifiers 132 can amplify receive signals that are filtered by the multiplexer 134. Alternatively or additionally, one or more power amplifiers of the one or more radio frequency amplifiers 132 can amplify transmit signals that are subsequently filtered by the multiplexer 134. The multiplexer 134 can be implemented in accordance with any suitable principles and advantages disclosed herein. For example, the multiplexer 134 can be any multiplexer disclosed herein. The packaging substrate 135 can be a laminate substrate, for example.

FIG. 14 is a schematic block diagram of a module 140 that includes a multiplexer 134 and a switch 142 according to an embodiment. The switch 142 can selectively electrically connect the multiplexer 134 to an antenna port of the module 140. The switch 142 can be a multi-throw radio frequency switch. In such instances, the switch 142 can electrically connect the multiplexer 134 or one or more other filters/multiplexers to the antenna.

FIG. 15 is a schematic block diagram of a module 150 that includes one or more radio frequency amplifiers 132, a multiplexer 134, and a switch 142 according to an embodiment. The module 150 can include elements of the module 130 and elements of the module 140.

Figure 16:
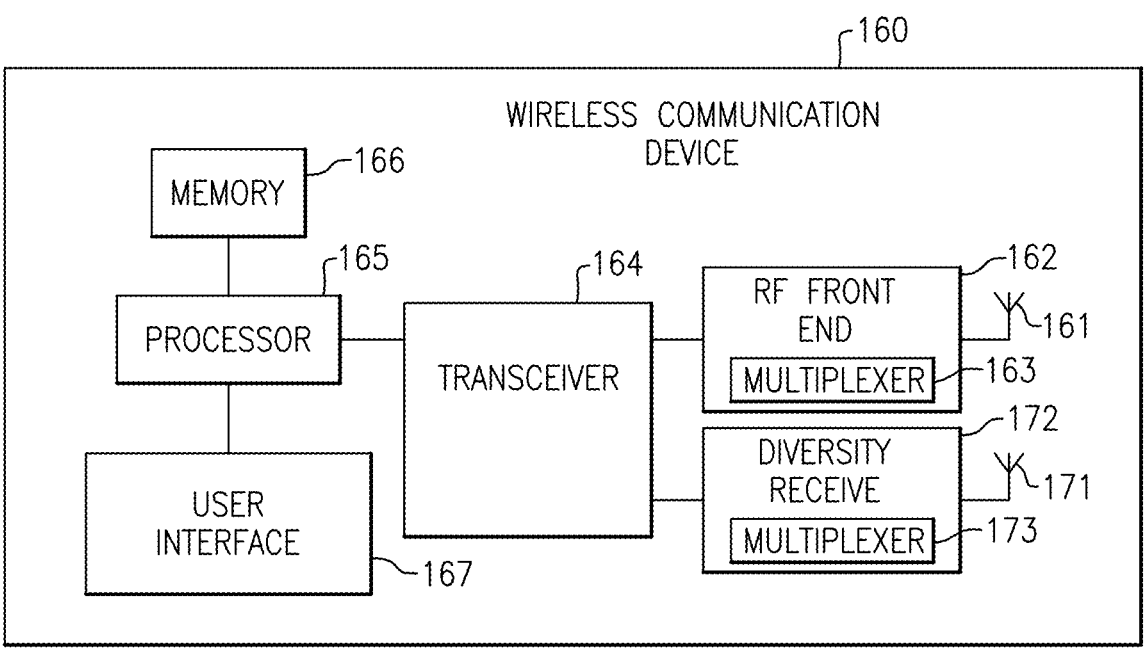
FIG. 16 is a schematic block diagram of a wireless communication device that includes a multiplexer according to an embodiment.

The multiplexers disclosed herein can be implemented in wireless communication devices. FIG. 16 is a schematic block diagram of a wireless communication device 160 that includes a multiplexer according to an embodiment. The wireless communication device 160 can be any suitable wireless communication device. For instance, a wireless communication device 160 can be a mobile phone, such as a smart phone. As illustrated, the wireless communication device 160 includes an antenna 161, a radio frequency (RF) front end 162 that includes a multiplexer 163, a transceiver 164, a processor 165, a memory 166, a user interface 167, a diversity antenna 171, and a diversity module 173 including a multiplexer 173. In some instances, the diversity module 173 can be considered part of a radio frequency front end.

The antenna 161 can transmit RF signals provided by the RF front end 162. Such RF signals can include carrier aggregation signals. The antenna 161 can receive RF signals and provide the received RF signals to the RF front end 162 for processing. Such RF signals can include carrier aggregation signals. The antenna 171 can received RF signals from the diversity antenna 171 and provide the received RF signals to the RF front end 162 for processing. Such RF signals can include carrier aggregation signals.

The RF front end 162 can include one or more power amplifiers, one or more low noise amplifiers, one or more RF switches, one or more multiplexers 163, one or more other filters, or any suitable combination thereof. The RF front end 162 can transmit and receive RF signals associated with any suitable communication standards. The multiplexer 163 can be implemented in accordance with any suitable principles and advantages disclosed herein.

The diversity module 172 can include more low noise amplifiers, one or more RF switches, one or more multiplexers 173, one or more other filters, or any suitable combination thereof. The multiplexer 173 can be implemented in accordance with any suitable principles and advantages disclosed herein. The diversity module 172 can perform any suitable diversity receive signal processing.

The RF transceiver 164 can provide RF signals to the RF front end 162 for amplification and/or other processing. The RF transceiver 164 can also process an RF signal provided by a low noise amplifier of the RF front end 162. The RF transceiver 164 can process an RF signal provided by a low noise amplifier of the diversity receive module 172. The RF transceiver 164 is in communication with the processor 165. The processor 165 can be a baseband processor. The processor 165 can provide any suitable base band processing functions for the wireless communication device 160. The memory 166 can be accessed by the processor 165. The memory 166 can store any suitable data for the wireless communication device 160. The processor 165 is also in communication with the user interface 167. The user interface 167 can be any suitable user interface, such as a display.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, multiplexer, devices, modules, wireless communication devices, apparatus, methods, and systems described herein may be embodied in a variety of other forms. Furthermore, various omissions, substitutions and changes in the form of the filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer for filtering radio frequency signals, the multiplexer comprising:

a first filter coupled to a common node via a switch, the first filter including an acoustic filter having a plurality of acoustic wave resonators arranged to filter a radio frequency signal, a matching network coupled to a node between the acoustic filter and the switch, a first parallel circuit coupled in series between the acoustic filter and the switch, and a second parallel circuit coupled in series with the first parallel circuit, the second parallel circuit having a different structure from the first parallel circuit, the first and second parallel circuits each including an inductive component in parallel with a capacitive component; and a second filter coupled to the common node.

2. The multiplexer of claim 1 further comprising a third filter coupled to the common node, at least one of the first and second parallel circuits of the first filter configured to cause a difference in phase between a reflection coefficient for the first filter at the common node in a passband of the second filter and the reflection coefficient for the first filter at the common node in a passband of the third filter to be reduced.

3. The multiplexer of claim 2 wherein the second filter and the third filter both have fixed connections to the common node.

4. The multiplexer of claim 2 further comprising a fourth filter coupled to the common node, at least one of the first and second parallel circuits of the first filter further configured to cause a difference in phase between the reflection coefficient of the first filter at the common node in the passband of the second filter and the reflection coefficient of the first filter at the common node in a passband of the fourth filter to be reduced.

5. The multiplexer of claim 1 wherein the matching network includes a shunt inductor.

6. The multiplexer of claim 1 wherein the matching network includes a Pi matching network.

7. The multiplexer of claim 1 wherein the matching network is coupled to the switch via at least one of the first and second parallel circuits.

8. The multiplexer of claim 1 wherein the capacitive component of the first parallel circuit is an acoustic resonator and the inductive component of the first parallel circuit is an inductor.

9. The multiplexer of claim 1 wherein the capacitive component of the first parallel circuit is a capacitor and the inductive component of the first parallel circuit is an inductor.

10. The multiplexer of claim 9 wherein the capacitive component of the second parallel circuit is an acoustic resonator and the inductive component of the second parallel circuit is a second inductor.

11. The multiplexer of claim 1 wherein the first filter has a highest passband of all filters of the multiplexer.

12. The multiplexer of claim 1 wherein the first filter has a lowest passband of all filters of the multiplexer.

13. The multiplexer of claim 1 wherein the acoustic filter further includes an inductor-capacitor circuit.

14. The multiplexer of claim 1 further comprising one or more additional filters coupled to the common node, the first filter having a passband with a greatest frequency difference from a passband any other filter in the multiplexer.

15. A multiplexer for filtering radio frequency signals, the multiplexer comprising:

a first filter coupled to a common node, the first filter including an acoustic filter arranged to filter a radio frequency signal, a matching network coupled to a node between the acoustic filter and the common node, a first parallel circuit coupled in series between the acoustic filter and the common node, and a second parallel circuit coupled in series with the first parallel circuit, the second parallel circuit having a different structure from the first parallel circuit, the first and second parallel circuits each including an inductive component in parallel with a capacitive component; and a second filter coupled to the common node, the first filter and the second filter each having a respective fixed connection to the common node.

16. The multiplexer of claim 15 wherein the matching network is coupled to the common node via the first parallel circuit.

17. The multiplexer of claim 15 wherein the capacitive component of the first parallel circuit is a capacitor and the inductive component of the first parallel circuit is an inductor, and the capacitive component of the second parallel circuit is an acoustic resonator and the inductive component of the second parallel circuit is a second inductor.

18. A radio frequency module comprising:

a multiplexer including first filter coupled to an common node via a switch and a second filter coupled to the common node, the first filter including an acoustic filter arranged to filter a radio frequency signal, a matching network coupled to a node between the acoustic filter and the switch, a first parallel circuit coupled in series between the acoustic filter and the switch, and a second parallel circuit coupled in series with the first parallel circuit, the second parallel circuit having a different structure from the first parallel circuit, the first and second parallel circuits each including an inductive component in parallel with a capacitive component; and a radio frequency circuit element coupled to the multiplexer, the multiplexer and the radio frequency circuit element being enclosed within a common package.

19. The radio frequency module of claim 18 wherein the capacitive component of the first parallel circuit is a capacitor and the inductive component of the first parallel circuit is an inductor, and the capacitive component of the second parallel circuit is an acoustic resonator and the inductive component of the second parallel circuit is a second inductor.

* * * * *